United States Patent [19]
Dai

[11] Patent Number: 5,670,404
[45] Date of Patent: Sep. 23, 1997

[54] METHOD FOR MAKING SELF-ALIGNED BIT LINE CONTACTS ON A DRAM CIRCUIT HAVING A PLANARIZED INSULATING LAYER

[75] Inventor: Chang-Ming Dai, Hsinchu, Taiwan

[73] Assignee: Industrial Technology Research Institute, Hsinchu, Taiwan

[21] Appl. No.: 667,697

[22] Filed: Jun. 21, 1996

[51] Int. Cl.$^6$ ................................................ H01L 21/70
[52] U.S. Cl. .......................... 437/52; 437/60; 437/919
[58] Field of Search ................................ 437/47, 48, 50, 437/52, 60, 919

[56] References Cited

U.S. PATENT DOCUMENTS

| | | | |
|---|---|---|---|
| 4,971,924 | 11/1990 | Tigelaar et al. | 437/60 |
| 5,422,315 | 6/1995 | Kobayashi | 437/228 |
| 5,476,805 | 12/1995 | Woo et al. | 437/52 |
| 5,491,103 | 2/1996 | Ahn et al. | 437/52 |

Primary Examiner—Jey Tsai
Assistant Examiner—Joni Y. Chang
Attorney, Agent, or Firm—George O. Saile

[57] ABSTRACT

An improved method for fabricating self-aligned contacts in a planar insulating layer to the source/drain contact areas on field effect transistors (FETs), formed in part from a first polycide layer, is achieved using an undoped polysilicon layer as an etch-stop layer. The planar insulating layer provides a good surface for patterning a second polycide layer without intralevel shorts that would otherwise occur over a rough topography. This is of particular use for forming the array of bit lines over the array of word lines for DRAM circuits. The method involves providing a patterned undoped polysilicon layer on the gate electrodes. A planarized insulating layer, such as reflowed borophosphosilicate glass (BPSG) is then deposited and reflowed to fill the high aspect ratio recesses between the closely spaced word lines. The bit line contact openings are anisotropically plasma etched in the BPSG to the FET source/drain contact areas, while using the undoped polysilicon layer over the gate electrodes as an etch-stop layer to form self-aligned contacts without etching into the gate electrodes.

23 Claims, 4 Drawing Sheets

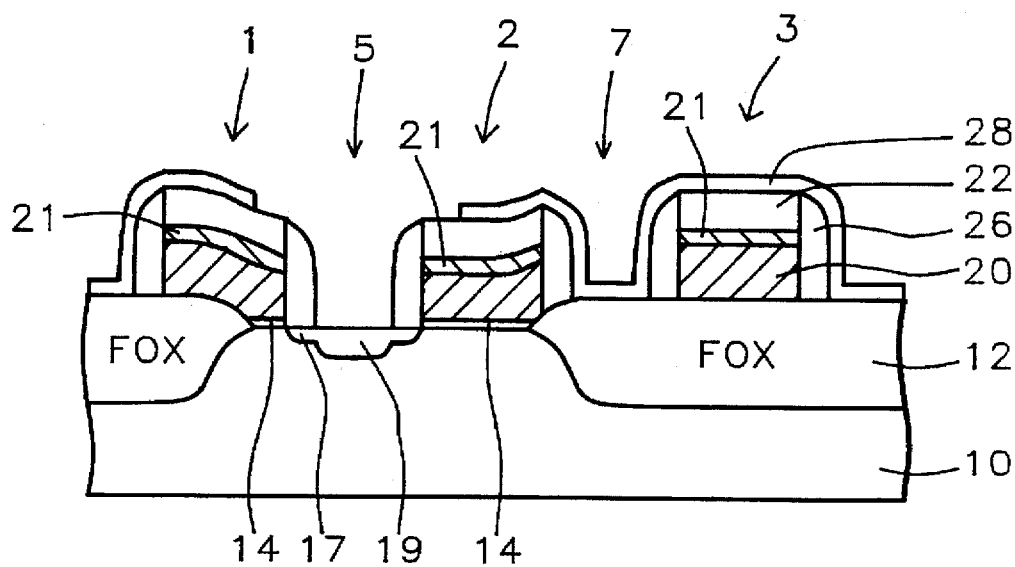
FIG. 1 – Prior Art
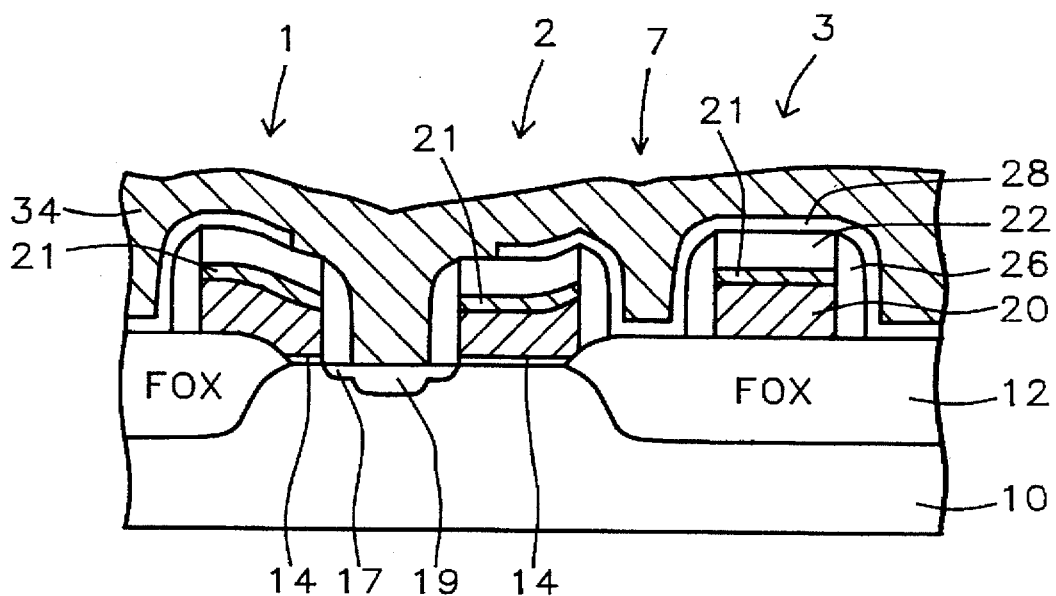
FIG. 2 – Prior Art

METHOD FOR MAKING SELF-ALIGNED BIT LINE CONTACTS ON A DRAM CIRCUIT HAVING A PLANARIZED INSULATING LAYER

BACKGROUND OF THE INVENTION

(1) Field of the Invention

This invention relates to a method for making dynamic random access memory (DRAM), and more particularly to a method for forming bit line contacts through a planar insulating layer for DRAM field effect transistors (FETs). This allows the formation of an array of closely spaced bit lines, free of intralevel shorts. The planar insulating layer eliminates deep troughs between the word lines making it easier to etch the bit lines without residue.

(2) Description of the Prior Art

In recent years, the integrated circuit density on semiconductor substrates has dramatically increased and the minimum feature sizes, such as the field effect transistor (FET) channel lengths and the word line widths on dynamic random access memory (DRAM) have dramatically decreased. These minimum feature sizes currently are less than a half-micrometer in size. For example, current line widths formed from a first polysilicon layer and the spacings between these lines are now about 0.3 micrometer (um) in width. Unfortunately, to maintain a reasonably low electrical resistance in these interconnecting lines, the vertical dimensions, that is the thickness of the polysilicon layer, cannot be proportionally scaled down in thickness. This has resulted in semiconductor substrate structures having exceptionally high aspect ratios (e.g., greater than 1.0). This rough topography makes it difficult to pattern the next level of polysilicon or polycide (polysilicon/silicide) interconnecting lines. For example, when a conformal electrical insulating layer is formed over the first level of interconnections, and a second level of polysilicon or silicide interconnections is formed over this rough underlying topography, it is difficult to pattern the second level of polysilicon or polycide interconnections. This difficulty arises from the directional nature of the etching required to form the narrow line widths in the second polysilicon or polycide layer to form the second level of interconnections. More specifically, it is difficult to remove completely the second level polysilicon layer in the high aspect ratio recesses (spaces) between the lines in the underlying patterned first polysilicon layer. This polysilicon residue that remains in the high aspect ratio recesses between adjacent lines of the second interconnecting level results in undesirable intralevel shorts.

To better understand the nature of this problem, a conventional prior-art method for forming bit lines over the underlying gate electrode/word line structure on a DRAM device is described with respect to the drawings shown in FIGS. 1 and 2. Typically, each memory cell in the array of DRAM cells is composed of a single FET having a storage capacitor connected to one of the two FET source/drain contact areas (node contact), and a bit line contacting the second source/drain contact area. One method of making the DRAM device is the Capacitor Over Bit lines (COB) method, in which the FET gate electrodes and interconnecting word lines are formed from a patterned first polysilicon layer, and the bit lines are formed from a second polysilicon or polycide layer before the storage capacitors are fabricated.

Shown in FIG. 1 is a schematic cross-sectional view of a portion of a silicon substrate 10 having partially completed COB DRAM cells. Two gate electrodes, labeled 1 and 2, sharing a common bit line contact 5, and a word line 3 are shown in the FIG. For this layout design, the cross section through the FET storage node contact is not shown. After a gate oxide 14 is grown on the device areas between the field oxide regions 12, the FET gate electrodes and word lines are formed. The FET gate electrodes are formed by patterning a first polysilicon layer 20 and silicide layer 21 having a first insulating layer 22 on the surface. Lightly doped source/drain regions 17 are formed by implantation, and sidewall spacers 26 are formed next by depositing and etching back a conformally deposited dielectric layer. The word lines, such as word line 3 in FIG. 1, is formed on the field oxide 12 at the same time. A second conformal insulating layer 28 is then deposited, and contact openings are etched to the common source/drain areas (such as area 5 in FIG. 1) by using self-aligned contact techniques. During this processing, the spacings between the word lines and also between the gate electrodes become very narrow resulting in very high aspect ratio recesses. For example, crevasses as narrow as 0.04 um can form. Now, as shown in FIG. 2, a second polysilicon layer or polycide layer 34 is deposited, and patterned to form an array of bit lines essentially orthogonal to the array of word lines 3 (and gate electrodes). As is clearly seen, layer 34 is much thicker in the recessed areas 7, and therefore is difficult to remove when the bit lines are patterned from layer 34.

An alternate prior-art approach used to avoid the above bit line etching problem is to use a conformal silicon nitride ($Si_3N_4$) layer, as an etch-stop layer in place of the insulating layer 28. A low flow temperature glass, such as borophosphosilicate glass (BPSG), is deposited and annealed to fill the recesses 7 and to form a planar layer. The bit line contact openings are then formed by selectively etching the BPSG layer to the $Si_3N_4$ layer, also by using self-aligned etching techniques. This, however, has several disadvantages. First, one would require a high selective directional etch of BPSG to $Si_3N_4$, which is difficult to achieve, and second, if the $Si_3N_4$ layer is in direct contact with the silicon substrate, defects due to stress can occur in the devices. Therefore, one must use non-self-aligned bit line contacts to avoid these problems, which require that the design ground rules be relaxed, and consequently, the device packing density is reduced.

Another method of making a Capacitor Over Bit line (COB) DRAM structure is described by Woo et al., U.S. Pat. No. 5,476,805. Although Woo teaches a method for making a common bit line contact between two FETs, he does not show the importance, or teach a method for patterning the bit line polysilicon layer over a high density array of word lines having these high aspect ratio recesses.

In U.S. Pat. No. 5,422,315, Kobayashi describes a method for forming bit lines after forming the array of capacitors. Kobayashi further teaches a design layout which allows the formation of self-aligned node contacts for the capacitors using two insulating layers that are also used to completely fill the narrow spacings between adjacent word lines to avoid the slit-like grooves that make it difficult to pattern an overlaying polysilicon layer. However, Kobayashi's method is very dependent on the design ground rules spacings to achieve a planar insulating surface However, there is still a need in the industry to provide a method that is less dependent on ground rules for eliminating these slit-like grooves or high aspect ratio recesses of various widths, and at the same time allow for the ability to form self-aligned bit line contacts in a planarized insulating layer.

SUMMARY OF THE INVENTION

It is a principal object of this invention to make self-aligned bit line contacts in a planarized insulating layer for DRAM devices using a novel etch-stop layer.

It is another object of the present invention to form an array of bit lines on this planarized insulating surface, thereby avoiding polysilicon residue that would otherwise occur in high aspect ratio recesses if the underlying insulating layer is not planar.

Now in summary, the invention describes a method for forming these self-aligned bit line contact openings in a planarized insulating layer on dynamic random access memory (DRAM) devices. The planarized insulating layer eliminates the presence of a rough topography that commonly occurs in the prior art. Therefore, the polycide bit lines are patterned on a planarized insulating layer, and eliminates the problem of residual polysilicon that would otherwise occur during the etching of the bit lines.

The method begins by providing a semiconductor substrate, preferably a P-doped single crystal silicon substrate. Device areas on the substrate are formed surrounded and isolated from each other by a Field OXide (FOX). A gate oxide is thermally grown on the substrate device areas on which the field effect transistors (FETs) for the array of DRAM cells are now formed. Each DRAM cell in the array of memory cells is made up of a single FET having a bit line contact to one of the two source/drain contacts and a capacitor node contact to the other source/drain contact.

A first polycide layer is formed by depositing a heavily in situ N-doped first polysilicon layer and a silicide layer over the gate oxide and elsewhere on the FOX regions. Next, a first insulating layer is deposited, for example using LPCVD and tetraethosiloxane (TEOS). Then an etch-stop layer is deposited on the first insulating layer, preferably composed of an undoped polysilicon. The etchstop layer, the first insulating layer, and the first polycide layer are then patterned using conventional photolithographic techniques to form the FET gate electrodes in the device areas, and interconnecting word lines elsewhere on the substrate. The etch-stop layer is further patterned, leaving portions over the gate electrodes adjacent to the source/drain contact areas where the bit line contact openings are to be made, while removing portions elsewhere on the gate electrodes and word lines. This is done to prevent electrical shorting between adjacent bit lines when they are later formed. One method of achieving these isolated etch-stop regions is by using a photoresist and exposing it with a reversed tone bit line contact mask. For example, a positive photoresist can be used and exposed using the reversed tone bit line contact mask, or by using a negative photoresist and the bit line contact mask. The exposure to the ultraviolet (UV) radiation can be increased to provide an oversize image in the negative resist. The etch-stop layer (undoped polysilicon) is then plasma etched to pattern the layer. Later in the process, the bit line mask is used again to pattern the positive resist, and to etch the contact openings aligned over the oversized etch-stop mask regions. Next, lightly doped source/drain areas are formed adjacent to the gate electrodes in the device areas by implanting an N-type dopant, such as arsenic ($As^{75}$) or phosphorus ($P^{31}$).

A conformal second insulating layer, such as silicon oxide ($SiO_2$), is deposited, preferably by LPCVD using TEOS. The second insulating layer is then anisotropically plasma etched back to form sidewall spacers on the gate electrodes and concurrently on the array of word lines.

A conformal third insulating layer is deposited to electrically insulate the device contact areas, and also serves as a barrier layer to prevent out-diffusion of dopant from a borophosphosilicate glass (BPSG) that is deposited next as a fourth insulating layer. The low flow temperature glass (BPSG) is now deposited to fill the high aspect ratio recesses between the word lines and thereby provide a planar surface. The fourth insulating layer, composed of BPSG, is thermally annealed to locally planarize the surface of the insulator over the array of word lines. Using a patterned photoresist layer, the contact openings for the bit lines are formed over the desired source/drain areas and are also aligned over the patterned etch-stop layer. The contact openings formed in the photoresist layer that extend over the portions of the etch-stop layer provide the means for self-aligning the bit line contacts to the gate electrodes when the BPSG and the third insulating layer are etched to the surface of the source/drain areas. The bit line contact openings are now selectively and anisotropically etched in the fourth and third insulating layers to form the self-aligned bit line contacts.

A conformal second polycide layer is deposited in the bit line contact openings and elsewhere on the planar fourth insulating layer using LPCVD. The polycide layer is composed of a polysilicon layer which is in-situ heavily doped with $N^+$ impurities, for example by adding a dopant gas containing phosphorus (P), and a refractory metal silicide layer, such as tungsten silicide ($WSi_2$) or titanium silicide ($TiSi_2$), is then deposited on the polysilicon layer, and patterned to form the array of polycide bit lines. The patterning of the polycide layer over the planar fourth insulating layer is now free of intralevel shorts that would have been caused by residual polysilicon on a rough topography.

BRIEF DESCRIPTION OF THE DRAWINGS

The objects and advantages of this invention are best understood by the following embodiment, and with reference to the attached drawings which are now briefly described.

FIGS. 1 and 2 show a cross-sectional view of a partially completed DRAM storage cell having a conventional self-aligned bit line contact common to two gate electrodes by the prior art. The drawings depict deep recesses between adjacent word lines, which make patterning the overlying bit lines difficult to achieve without leaving a polysilicon residue between adjacent bit lines.

DESCRIPTION OF THE PREFERRED EMBODIMENTS

Now, in keeping with the objects of this invention, the detailed method is described for achieving improved self-aligned bit contact openings in a planar insulating layer over an array of FET gate electrodes used to make the dynamic random access memory (DRAM) cells. The method is described for an array of memory cells having N-channel FETs. However, it should be well understood by those skilled in art that the method of this invention can be equally applied to integrated circuits in which both N- and P-wells are used, and from which both P- and N-channel FETs can be formed, which provides for the formation of CMOS circuits.

Figure 3:
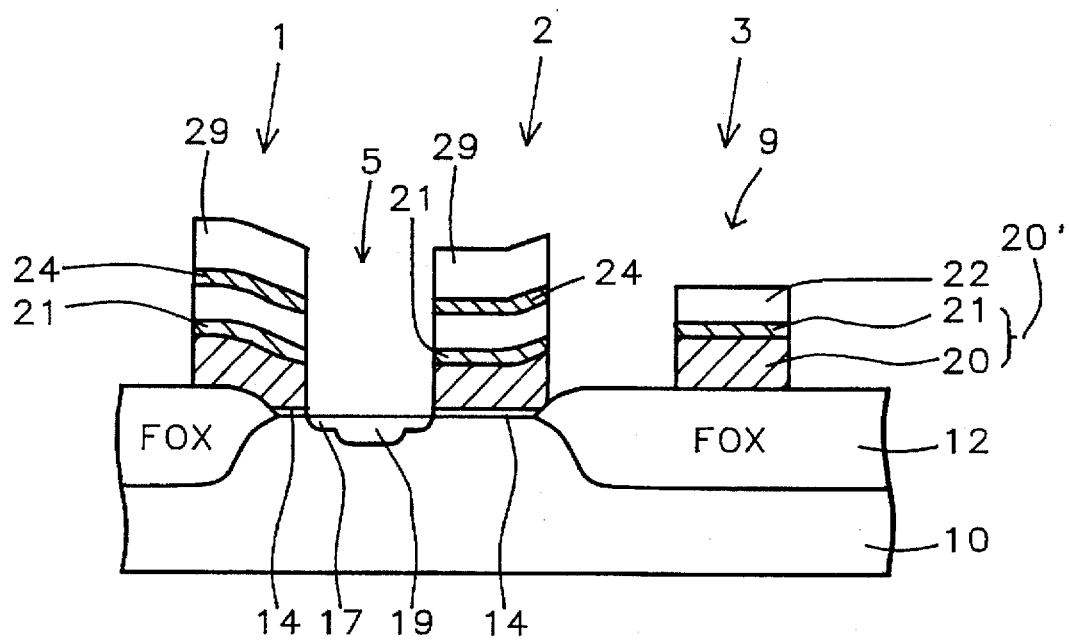
FIGS. 3 through 7 depict in schematic cross-sectional view the sequence of process steps for making the improved self-aligned bit contacts in a planar insulating layer on FET gate electrodes, and for forming an array of bit lines that are patterned without polysilicon residue by the method of this invention.

Referring to FIG. 3, a schematic cross-sectional view of a substrate 10 is shown for a portion of a dynamic random access memory (DRAM) storage cell. Only two adjacent and closely spaced field effect transistor (FET) gate electrodes 1 and 2, and a word line 3 are shown to simplify the drawing and discussion. The preferred substrate for forming the DRAM is composed of a P-type single crystal silicon with <100> crystallographic orientation. In this circuit design the FET gate electrodes 1 and 2 share a common bit line contact 5. A partially planarized Field OXide (FOX) region 12 is also shown in FIG. 3, surrounding and electrically isolating the device areas. Although the process for forming the FOX is not depicted in FIG. 3, the method most commonly practiced in the industry consists of using a thin thermal oxide (pad oxide), and a silicon nitride ($Si_3N_4$) as an oxidation-resistant mask. The desired FOX regions are etched open in the oxide/nitride layer using conventional photolithographic techniques, and a field oxide is thermally grown, typically to a thickness of about 4500 to 5500 Angstroms. The FOX is then planarized to provide an improved surface on which the DRAM structures are fabricated. One method of planarizing the FOX layer is by depositing a planarizing layer, such as photoresist, and then partially etching back both the resist and oxide layers. An alternate method for forming the planar FOX is by a method commonly referred to as sidewall-mask isolation (SWAMI), in which a recess is etched in the silicon substrate, and then after forming a sidewall barrier in the recess, the field oxide is thermally grown. The $Si_3N_4$ and pad oxide layers are then removed by wet etching using, for example, a hot phosphoric acid ($H_3PO_4$) to remove the silicon nitride, and dilute hydrofluoric acid (HF) to remove the pad oxide. The silicon surface is then carefully cleaned and a good quality thermal oxide is grown to form the gate oxide 14, as shown in FIG. 3. The preferred thickness of layer 14 is between about 60 and 150 Angstroms.

Referring still to FIG. 3, the gate electrode structures 1 and 2 and word line 3 are formed next. A first polycide layer 20', which includes a polysilicon film 20 and a tungsten silicide ($WSi_2$) film 21 is deposited using, for example, a low pressure chemical vapor deposition (LPCVD) process, and using, for example, silane ($SiH_4$) and tungsten hexafluoride, respectively, as the reactant gases. The preferred thickness of layer 20' is in the range of about 1000 to 3000 Angstroms. The first polycide layer 20' is preferably composed of an in-situ heavily doped polysilicon using an N-type impurity such as arsenic (As) or phosphorus (P), and a $WSi_2$ film. For example, the doping can be achieved by adding a dopant gas such as arsine ($AsH_3$) or phosphine ($PH_3$) to the $SiH_4$. A first insulating layer 22 is deposited on the polycide layer 20' using, for example, LPCVD and tetraethosiloxane (TEOS) to form a silicon oxide ($SiO_2$) layer. Preferably the thickness of layer 22 is between about 1000 and 3000 Angstroms. Now, important to this invention, an etch-stop layer 24 is then deposited on the first insulating layer 22, which will later serve to form the self-aligned contact openings for the bit lines. Preferably etch-stop layer 24 is composed of an undoped polysilicon and is also deposited by LPCVD using, for example, $SiH_4$ as the reactant gas. The preferred thickness of layer 24 is between about 500 and 1500 Angstroms.

Still referring to FIG. 3, the stacked layers comprised of the etch stop layer 24, the first insulating layer 22, and the first polycide layer 20' are now patterned using conventional photolithographic techniques, and anisotropically plasma etched to form an array of gate electrodes and word lines. Two of the gate electrodes 1 and 2 and one of the word lines 3 are depicted in FIG. 3. Preferably the anisotropic plasma etching is carried out in a reactive ion etcher (RIE) using three etching steps. The first step is to etch the etch-stop layer 24 using a reactant gas such as $Cl_2$ (10/50 sccm), HBr (30/100 sccm), and $O_2$. The second step is to etch the first insulating layer 22 by using a reactant gas such as $CHF_3$ (30/100 sccm), $CF_4$, and $H_2$. The third step is to etch the first polycide layer 20' by the same reactant gases as in step 1.

Continuing with the process and an important step in the invention, the undoped polysilicon etch-stop layer 24 is patterned to provide an etch-stop aligned over the gate electrodes adjacent to the bit line contact areas 17, while removing the layer 24 elsewhere on the gate electrodes to prevent electrical shorts between the bit lines that are later formed. The preferred method of patterning layer 24 is to use a photoresist having a reversed tone bit line contact mask that is oversized. One method of achieving these isolated etch-stop regions is by using a negative photoresist, which is then optically exposed, for example, using a bit line contact opening mask designed to be used with a positive photoresist for making the bit line contact openings. This provides a patterned photoresist etch-mask layer 29 over the etch-stop layer 24 on the gate electrodes, as shown in FIG. 3, adjacent to the bit line contact areas 17. The etch-stop layer 24 is removed by plasma etching elsewhere on the substrate, such as over other areas on the gate electrodes and word lines (such as over word line 9 in FIG. 3). The optical exposure to the ultraviolet radiation (UV) can be increased to provide an oversize image in the negative resist. The etch-stop layer 24 (undoped polysilicon) is then plasma etched to pattern the layer. As will be seen later in the process, the bit line mask is used again to pattern a positive photoresist for etching the contact openings in the planar insulating layer aligned over the oversized etch-stop mask regions. Alternatively, a positive photoresist With a reversed tone bit line contact mask can also be used. One preferred negative photoresist that can be used for this purpose is Novalak type NFR013 manufactured by the JSR company of Japan. The polysilicon etch-stop layer is then anisotropically plasma etched using, for example, reactive ion etching and a gas mixture, for example, such as $Cl_2$, HBr, $O_2$, and the etching conditions are selected to provide a high selectivity to the gate oxide for avoiding etching into the source/drain silicon contacts.

The next step is to form the lightly doped source/drain areas 17 for the N-channel FETs. The doping is usually accomplished by implanting an N-type species, such as arsenic or phosphorus. For example, a typical implant might consist of phosphorus ($P^{31}$) at a dose in the range of between about 1 E 13 and 1 E 14 ions/$cm^2$, and at an ion energy of between about 30 and 80 KeV. As generally practiced in the industry, a photoresist mask can be used to avoid implanting in areas not requiring implant.

Figure 4:
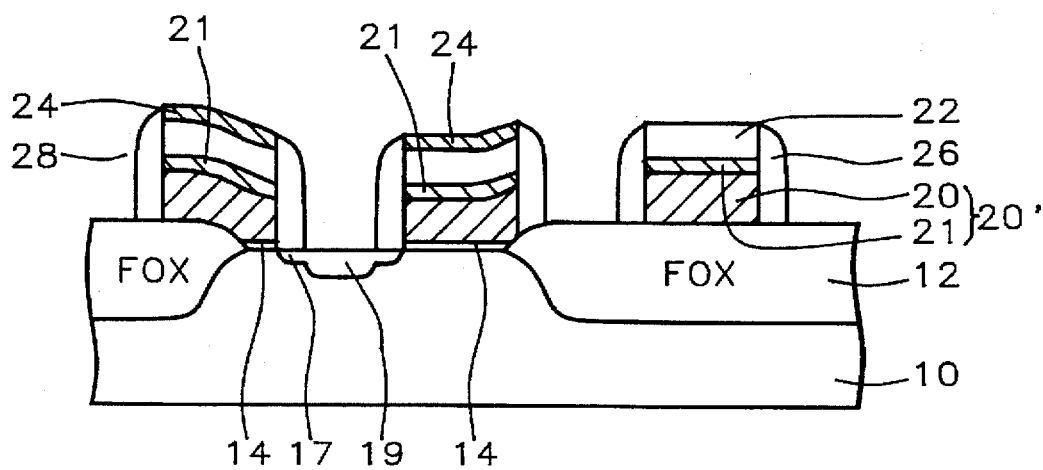

Referring to FIG. 4, after forming the lightly doped source/drain areas, sidewall spacers 26 are formed on the gate electrode structure. These spacers are formed by depositing a conformal second insulating layer 26, such as silicon oxide ($SiO_2$), and using an anisotropic plasma etch to etch back to the surface of the source/drain areas leaving portions of the $SiO_2$ on the gate electrode sidewalls. For example, the $SiO_2$ can be deposited by LPCVD using TEOS at a temperature in the range of about 650° to 900° C. The etch-back can be accomplished in a reactive plasma etcher using a gas mixture, such as carbon tetrafluoride ($CF_4$) and hydrogen ($H_2$). Source/drain contacts 19 are formed adjacent to the sidewalls by ion implantation. For example, the doping can be done by implanting an N-type species, such as arsenic or phosphorus. Typically, the implant can consist of phosphorus ($P^{31}$) ions at a dose of between 2.0 E 15 to 1.0 E 16 ions/$cm^2$ with an ion implant energy of between about 20 and 70 KeV. Alternatively, the heavily doped source/drain contacts can be formed at a later step by out-diffusing from the bit line polysilicon layer.

Figure 5:
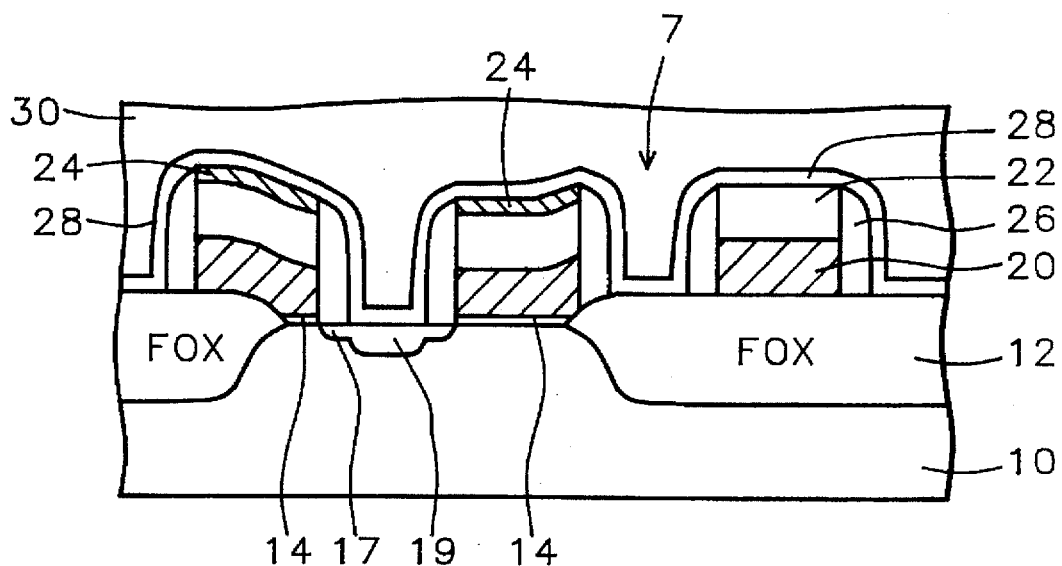

Referring to FIG. 5, a passivation, or third insulating layer 28 is now deposited forming a conformal layer over the gate electrode structure and in the recesses between gate electrodes to electrically insulate the device contact areas. Layer 28 is preferably composed of a silicon oxide ($SiO_2$), and is preferably deposited by using atmospheric pressure CVD using TEOS and ozone. The preferred thickness of layer 28 is between about 400 and 1500 Angstroms. Alternatively, layer 28 can be deposited using more conventional LPCVD TEOS methods.

As further shown in FIG. 5, a fourth insulating layer 30 is now deposited over layer 28. Preferably, the fourth insulating layer 30 is composed of a low flow temperature glass, such as borophosphosilicate glass (BPSG). For example, the BPSG can be deposited by LPCVD using silane ($SiH_4$) as the reactant gas, and dopant gases such as diborane ($B_2H_6$) and phosphine ($PH_3$). The preferred thickness of layer 30 is between about 2000 and 5000 Angstroms. Layer 30 is annealed at a temperature between about 800° and 900° C. for a time of between about 10 and 60 minutes, and more specifically is annealed at 850° C. for about 30 minutes to effectively planarize this insulating layer over the array of word lines. This essentially fills the high aspect ratio recesses 7 between the word lines, and thereby provides a planar surface on which the bit lines will be formed.

Figure 6:
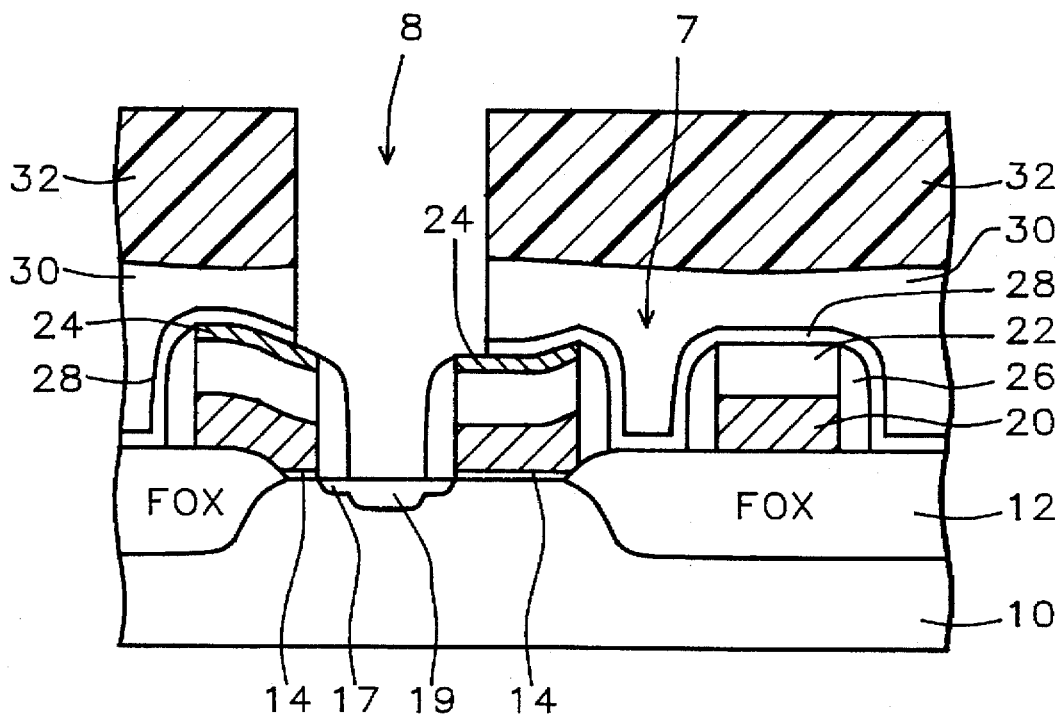

Referring to FIG. 6, a photoresist layer 32 is coated on the substrate over the planar insulating layer 30, and is patterned by photolithographic techniques to form openings over the areas where the bit line contact openings are to be etched. One of these openings 8 is depicted in FIG. 6. The openings in photoresist layer 32 also extend over the etch-stop layer 24. The bit line contact openings are now selectively and anisotropically etched in the planar insulating layer 30 and in the passivation layer 28 down to the etch-stop layer 24. Using the etch-stop layer as a mask, the etching is continued to the surface of the source/drain contact 19, thereby forming the self-aligned contact openings by the method of this invention. One of these contact openings is labeled 8 in FIG. 6. Preferably, the plasma etching is carried out in a reactive ion etcher (RIE), using a gas mixture having a high etch-rate selectivity between the BPSG layer 32 and the undoped polysilicon etch-stop layer 24. For example, a gas mixture composed of carbon tetrafluoride ($CF_4$) and hydrogen ($H_2$) can be used. Alternatively, other gases can be used having a high selective etch rate, such as trifluoromethane ($CHF_3$). The etch-rate ratio of BPSG to polysilicon is preferably between about 15:1 and 100:1.

Figure 7:
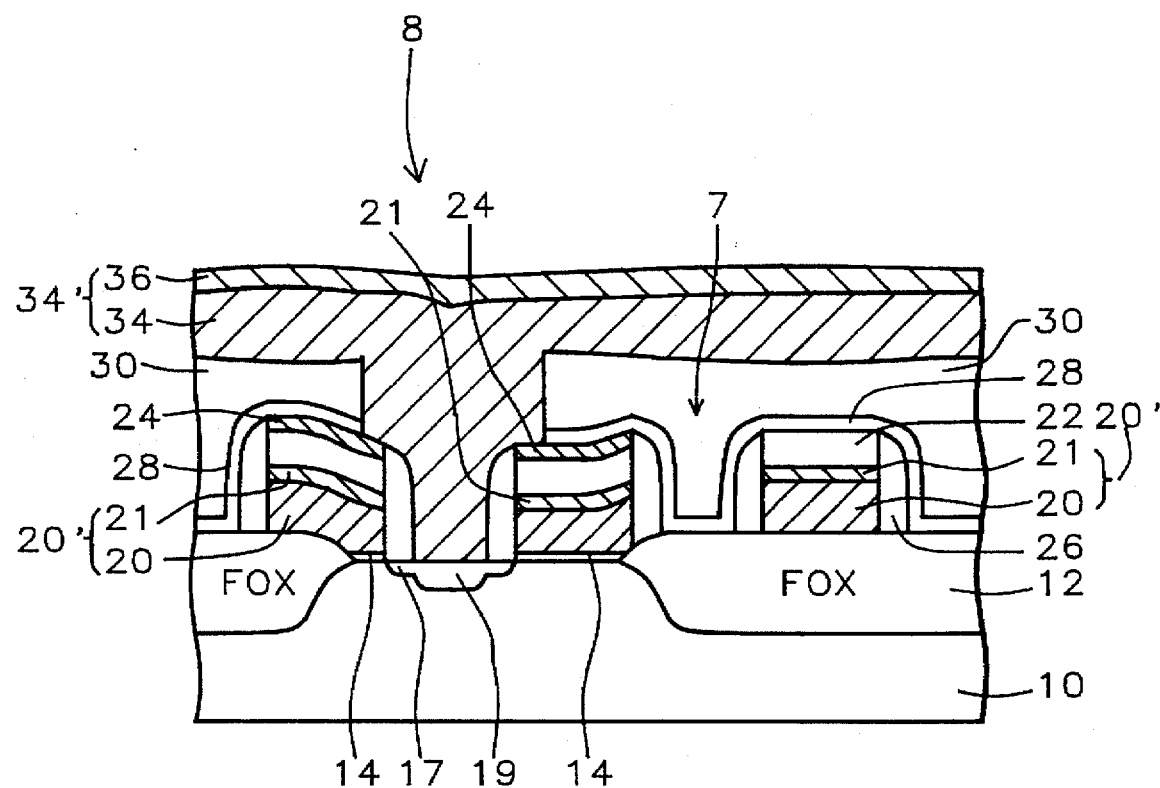

Referring to FIG. 7, after removing photoresist layer 32, a conformal second polycide layer 34' is deposited in the bit line contact openings 8 and elsewhere on the planar fourth insulating layer 30. The polycide layer 34' is composed of an in-situ doped polysilicon layer 34 having a thickness of between 500 and 1500 Angstroms, and a $WSi_2$ layer 36 having a thickness of between 500 and 1500 Angstroms. The polysilicon layer 34 is heavily doped $N^+$, such as with phosphorus (P). Layer 34 is preferably deposited using LPCVD and a reactant gas such as silane ($SiH_4$), and is preferably doped in situ by adding a dopant gas such as phosphine ($PH_3$). Typically the dopant concentration in layer 34 is between about 5.0 E 19 and 9.0 E 20 atoms/$cm^3$. The preferred thickness of layer 34' is between about 1000 and 3000 Angstroms. The tungsten silicide ($WSi_2$) layer 36 preferably can be deposited by CVD using, for example, a gas mixture of tungsten hexafluoride ($WF_6$) and silane ($SiH_4$), and can be deposited in a reactor such as the Genus 8720 System, manufactured by Genus Corp. of California, U.S.A.

The second polycide layer 34' is now patterned using conventional photolithographic techniques and anisotropic plasma etching to define and complete the array of polycide bit lines, essentially orthogonal to the array of word lines. FIG. 7 depicts a cross section through one of these word lines extending over the contact opening 8. It should be noted that the bit lines formed over the planar insulating layer 30 are free of intralevel shorts that would otherwise occur over the deep recesses, such as recess 7 in FIG. 7, if the layer 30 was not planar. Also worth noting is that the etch-stop layer 24 serves to form a self-aligned contact without etching into the gate electrode formed from the first polycide layer 20'.

While the invention has been particularly shown and described with reference to the preferred embodiments thereof, it will be understood by those skilled in the art that various changes in form and details may be made without departing from the spirit and scope of the invention.

What is claimed is:

1. A method for fabricating self-aligned bit line contacts on a dynamic random access memory device comprising the steps of:

providing a semiconductor substrate having device areas surrounded by field oxide areas;

forming a gate oxide on said device areas;

depositing a first polycide layer on said gate oxide and elsewhere on said field oxide areas;

depositing a first insulating layer over said first polycide layer;

depositing an etch-stop layer on said first insulating layer;

patterning said etch-stop layer, said first insulating layer, and said first polycide layer thereby forming an array of word lines, said word lines extending over said gate oxide forming field effect transistor gate electrodes;

removing portions of said etch-stop layer while leaving portions over said word lines adjacent to areas where bit line contact openings are desired;

forming lightly doped source/drain areas by ion implantation;

depositing a conformal second insulating layer and anisotropically plasma etching back said second insulating layer thereby forming sidewall spacers on said array of word lines;

depositing a conformal third insulating layer over said array of word lines;

depositing a fourth insulating layer over said third insulating layer;

planarizing said fourth insulating layer and filling recesses between said word lines;

coating a photoresist layer on said planar fourth insulating layer and providing openings over said desired bit line contact openings and further extending over said etch-stop layer on said word lines;

etching said bit line contact openings in said fourth and third insulating layers to said etch-stop layer, and continuing said etching of said fourth and third insulating layers between portions of said etch-stop layer to the surface of said device areas, thereby forming said self-aligned bit line contact openings;

depositing a conformal second polycide layer in said bit line contact openings and elsewhere over said planar fourth insulating layer;

patterning said second polycide and forming an array of polycide bit lines essentially orthogonal to said word lines, thereby completing said self-aligned bit line contacts and said bit lines.

2. The method of claim 1, wherein a polysilicon film in said first polycide layer is deposited in-situ doped with an N-type dopant.

3. The method of claim 1, wherein said first polycide layer thickness is between about 1000 and 3000 Angstroms.

4. The method of claim 1, wherein said first insulating layer is a chemical vapor deposited silicon oxide ($SiO_2$) having a thickness of between about 1000 and 3000 Angstroms.

5. The method of claim 1, wherein said etch-stop layer is an undoped polysilicon layer.

6. The method of claim 5, wherein said undoped polysilicon layer is between about 500 and 1500 Angstroms thick.

7. The method of claim 1, wherein said conformal third insulating layer is deposited to a thickness of between about 400 and 1500 Angstroms.

8. The method of claim 1, wherein said fourth insulating layer is a borophosphosilicate glass (BPSG) having a thickness of between about 2000 and 5000 Angstroms.

9. The method of claim 8, wherein said BPSG is locally planarized by annealing at a temperature of between about 800° and 900° C. for a time of between about 10 and 60 minutes.

10. The method of claim 1, wherein said bit line contact openings are formed by anisotropic plasma etching in a gas mixture of $CF_4$, $H_2$, and $CHF_3$.

11. The method of claim 10, wherein said anisotropic plasma etching has an etch-rate ratio of BPSG-etch-rate to undoped polysilicon-etch-rate of between about 15:1 and 100:1.

12. The method of claim 1, wherein said second polycide layer has a thickness of between about 1000 and 3000 Angstroms.

13. A method for fabricating self-aligned bit line contacts on a dynamic random access memory device comprising the steps of:

providing a semiconductor substrate having device areas surrounded by field oxide areas;

forming a gate oxide on said device areas;

depositing a first polycide layer on said gate oxide and elsewhere on said field oxide areas;

depositing a first insulating layer over said first polycide layer;

depositing an etch-stop layer on said first insulating layer, wherein said etch-stop layer is an undoped polysilicon layer;

patterning said etch-stop layer, said first insulating layer, and said first polycide layer thereby forming an array of word lines, said word lines extending over said gate oxide forming field effect transistor gate electrodes;

removing portions of said etch-stop layer while leaving portions over said word lines adjacent to areas where bit line contact openings are desired;

forming lightly doped source/drain areas by ion implantation;

depositing a conformal second insulating layer and anisotropically plasma etching back said second insulating layer thereby forming sidewall spacers on said array of word lines;

depositing a conformal third insulating layer over said array of word lines;

depositing a fourth insulating layer over said third insulating layer;

planarizing said fourth insulating layer and filling recesses between said word lines;

coating a photoresist layer on said planar fourth insulating layer and providing openings over said desired bit line contact openings and further extending over said etch-stop layer on said word lines;

etching said bit line contact openings in said fourth and third insulating layers to said etch-stop layer, and continuing said etching of said fourth and third insulating layers between portions of said etch-stop layer to the surface of said device areas, thereby forming said self-aligned bit line contact openings;

depositing a conformal second polycide layer in said bit line contact openings and elsewhere over said planar fourth insulating layer;

patterning said second polycide layer and forming an array of polycide bit lines essentially orthogonal to said word lines, thereby completing said self-aligned bit line contacts and said bit lines.

14. The method of claim 13, wherein a polysilicon film of said first polycide layer is deposited in-situ doped with an N-type dopant.

15. The method of claim 13, wherein said first polycide layer thickness is between about 1000 and 3000 Angstroms having a polysilicon film with a thickness of between about 500 and 1500 Angstroms and a tungsten silicide layer with a thickness of between about 500 and 1500 Angstroms.

16. The method of claim 13, wherein said first insulating layer is a chemical vapor deposited silicon oxide ($SiO_2$) having a thickness of between about 1000 and 3000 Angstroms.

17. The method of claim 13, wherein said undoped polysilicon layer is between about 500 and 1500 Angstroms thick.

18. The method of claim 13, wherein said conformal third insulating layer is deposited to a thickness of between about 400 and 1500 Angstroms.

19. The method of claim 13, wherein said fourth insulating layer is a borophosphosilicate glass (BPSG) having a thickness of between about 2000 and 5000 Angstroms.

20. The method of claim 19, wherein said BPSG is locally planarized by annealing at a temperature of between about 800° and 900° C. for a time of between about 10 and 60 minutes.

21. The method of claim 13, wherein said bit line contact openings are formed by anisotropic plasma etching in a gas mixture of $CF_4$, $H_2$, and $CHF_3$.

22. The method of claim 21, wherein said anisotropic plasma etching has an etch-rate ratio of BPSG-etch-rate to undoped polysilicon-etch-rate of between about 15:1 and 100:1.

23. The method of claim 13, wherein said second polycide layer thickness is between about 1000 and 3000 Angstroms having a polysilicon film with a thickness of between about 500 and 1500 Angstroms and a tungsten silicide layer with a thickness of between about 500 and 1500 Angstroms.

* * * * *